United States Patent

Eichhorn et al.

[11] Patent Number: 5,879,852
[45] Date of Patent: Mar. 9, 1999

[54] POSITIVE-WORKING RADIATION-SENSITIVE MIXTURE

[75] Inventors: Mathias Eichhorn, Niedernhausen; Gerhard Buhr, Koenigstein, both of Germany

[73] Assignee: AGFA-Gevaert AG, Leverkusen, Germany

[21] Appl. No.: 841,659

[22] Filed: Apr. 30, 1997

Related U.S. Application Data

[62] Division of Ser. No. 430,073, Apr. 27, 1995, Pat. No. 5,654,121.

[30] Foreign Application Priority Data

Apr. 28, 1994 [DE] Germany ............... 44 14 896.8

[51] Int. Cl.⁶ ............... C08F 8/14; C08F 8/10; G03C 7/039; G03C 1/52
[52] U.S. Cl. ............... 430/157; 430/170; 430/176; 430/270.1; 430/270.11; 430/326; 430/910; 522/31; 522/32; 522/29; 522/63; 522/67; 522/154; 526/313; 526/314; 526/328; 526/328.5; 526/329.2; 526/346; 526/347
[58] Field of Search ............... 526/313, 314, 526/328, 328.5, 329.2, 346, 347; 430/270.1, 270.11; 522/160, 178, 183, 188, 154, 31, 32, 29, 63, 67

[56] References Cited

U.S. PATENT DOCUMENTS

| | | | |
|---|---|---|---|
| 3,779,778 | 12/1973 | Smith et al. | 430/270 |
| 4,101,323 | 7/1978 | Buhr et al. | 430/270 |
| 4,247,611 | 1/1981 | Sander et al. | 430/270 |
| 4,248,957 | 2/1981 | Sander et al. | 430/270 |
| 4,250,247 | 2/1981 | Sander et al. | 430/270 |
| 4,311,782 | 1/1982 | Buhr et al. | 430/270 |
| 4,912,018 | 3/1990 | Osuch et al. | 430/270.1 |
| 5,130,392 | 7/1992 | Schwolm et al. | 430/270.1 |
| 5,350,660 | 9/1994 | Urano et al. | 430/270.1 |
| 5,352,564 | 10/1994 | Takeda et al. | 430/270.1 |
| 5,397,846 | 3/1995 | Eichhorn et al. | 526/265 |
| 5,558,971 | 9/1996 | Urano et al. | 430/270.1 |
| 5,558,976 | 9/1996 | Urano et al. | 430/326 |

FOREIGN PATENT DOCUMENTS

| | | |
|---|---|---|
| 0 102 450 | 3/1984 | European Pat. Off. |
| 0 234 327 | 9/1987 | European Pat. Off. |
| 0 264 908 | 4/1988 | European Pat. Off. |
| 0 366 590 | 5/1990 | European Pat. Off. |

*Primary Examiner*—Susan W. Berman
*Attorney, Agent, or Firm*—Foley & Lardner

[57] ABSTRACT

The invention relates to a positive-working radiation-sensitive mixture containing a) a polymeric binder having acid-labile groups and b) a compound which forms a strong acid on irradiation, in which the binder simultaneously contains units of the formulae I, II and III $$R^1\text{—OH} \tag{I}$$

$$R^1\text{—O—CO}_2R^2 \tag{II}$$

$$R^1\text{—O—CH}_2\text{—CHR}^3\text{—OH} \tag{III}$$

The mixture is used to coat radiation-sensitive recording material which can be used to produce printing plates and photoresists.

12 Claims, No Drawings

POSITIVE-WORKING RADIATION-SENSITIVE MIXTURE

This application is a division of application Ser. No. 08/430,073, filed Apr. 27, 1995 now U.S. Pat. No. 5,654,121.

BACKGROUND OF THE INVENTION

1. Field of the Invention

The invention relates to a positive-working radiation-sensitive mixture containing a) a polymeric binder having acid-labile groups and b) a compound which forms a strong acid on irradiation. It also relates to a radiation-sensitive recording material having a base and a radiation-sensitive coating produced from said mixture to be used for printing plates and photoresists.

The positive-working copying materials based on o-quinone diazides, in particular, have hitherto gained acceptance for such purposes. The photosensitivity of these materials is, however, frequently unsatisfactory. It can be increased by using catalytically active systems, since in such cases the quantum yield becomes greater than 1. Thus, the known principle of initiating subsequent reactions by means of photolytically produced acids in order to effect an increased solubility of the exposed areas has recently been exploited. In this case, photochemically produced strong acids catalyze the cleavage of acid-labile compounds whose cleavage products have a greater solubility than the original compounds in aqueous alkaline developers.

In positive-working radiation-sensitive mixtures, the acid-cleavable compounds used as low- and high-molecular-weight acetals and O,N-acetals containing aromatic compounds as hydroxyl or amine component (U.S. Pat. No. 3,779, 778), as are ortho esters and amide acetals (U.S. Pat. No. 4,101, 323), polymeric ortho esters (U.S. Pat. No. 4,311,782), polymeric aliphatic acetals (U.S. Pat. No. 4,247, 611), enol ethers (U.S. Pat. No. 4, 248,957) or N-acyliminocarbonates (U.S. Pat. No. 4,250,247). To initiate the cleavage reaction, such mixtures require not only the photochemically produced acid, but also water, and this results in problems in their practical usability, in particular if irradiation is carried out at different atmospheric humidity.

Polymers containing acid-labile tert-butoxycarbonyloxy or tert-butoxycarbonyl ("tBOC") groups which work positively when mixed with photochemical acid donors are described in EP-A 0 102 450 and 0 366 590. Although such systems do not require water to initiate the cleavage reaction, they are also, however, not free of disadvantages. The thermal stability of the photosensitive layers produced therewith is unsatisfactory. In J. Polym. Sci. A 24, 2971 (1986), H. Ito diagnoses the autocatalytic cleavage reaction due to acidic phenolic hydroxyl groups contained in the polymer as the reason for this. To solve the problem, Ito proposes the synthesis of block copolymers in which tBOC and phenolic OH groups are spatially separated. However, that is a method involving expensive preparation. EP-A 0 264 908 describes a polymer in which the tert-butoxycarbonyl groups are replaced by less easily cleavable sec-butoxycarbonyl or isopropoxycarbonyl groups, but this results in losses in the photosensitivity.

SUMMARY OF THE INVENTION

An object of the invention is to provide a positive-working radiation-sensitive mixture which is notable for high photosensitivity, very good storage stability even at elevated temperatures, and low dark erosion. It is also an object of the present invention to provide a radiation-sensitive recording material having a base and a radiation-sensitive coating produced from such mixtures to be used for printing plates and photoresists.

DETAILED DESCRIPTION OF PREFERRED EMBODIMENTS

The objects of the invention were achieved by a mixture which contains a) a polymeric binder having acid-labile groups and b) a compound which forms a strong acid on irradiation wherein the binder a) simultaneously contains units of the formulae I, II and III $$R^1\text{—OH} \tag{I}$$

$$R^1\text{—O—CO}_2R^2 \tag{II}$$

$$R^1\text{—O—CH}_2\text{—CHR}^3\text{—OH} \tag{III}$$

where $R^1$ is an optionally substituted phenyl radical bound in the main chain or side chain of a polymer, $R^2$ is a $(C_3-C_{11})$alkyl, $(C_3-C_{11})$alkenyl or $(C_7-C_{11})$ aralkyl radical, $R^3$ is a hydrogen atom, an optionally substituted alkyl or aryl radical, a phthalimidomethyl group or the group —$CH_2OR^4$, in which $R^4$ is a hydrogen atom, or an optionally substituted aliphatic, cycloaliphatic or aromatic radical.

The radical $R^2$ is preferably a $C_4$-alkyl, particularly preferably tert-butyl. If the radical $R^3$ is an alkyl, it is preferably a $(C_1-C_4)$alkyl; if it is an aryl, it is preferably phenyl. The radicals $R^3$ and/or $R^4$ may be different within one and the same polymer.

Surprisingly, the layers produced with the mixture according to the invention are particularly photosensitive and exhibit a low dark erosion at the unexposed points during the development. They can be stored for a prolonged time even at relatively high temperature.

The polymeric binders a) can be prepared by reaction of polymers containing phenolic hydroxyl groups with epoxides and activated carbonic esters in a single- or multistage process or polymerization or polycondensation of monomers whose phenolic hydroxyl groups have been reacted with epoxides, and monomers whose phenolic hydroxyl groups have been reacted with activated carbonic esters.

The polymers containing phenolic hydroxyl groups are preferably polyhydroxystyrene, poly (hydroxymethylstyrene) and poly(pyrocatechol monomethacrylate). Polymers and copolymers containing styrene, hydroxystyrene, hydroxymethylstyrene or hydroxyphenyl methacrylates, such as pyrocatechol monomethacrylate, as monomer units are generally suitable. Particularly preferred are poly(4-hydroxystyrene), poly(4-hydroxymethylstyrene), poly(pyrocatechol) monomethacrylate, copolymers of pyrocatechol monomethacrylate and styrene, and phenolic resins, for example, the known novolaks. The polymers or copolymers can be used on their own or as mixtures. Preferably, of the total number of the units of the formulae I, II and III in the binders a) according to the invention, 10 to 80% are units of the formulae II and III. Particularly preferred are those binders a) in which, of the total number of the units of the formulae I, II and III, 25 to 35% are units of the formula II and 10 to 50% are units of the formula III.

The monomers containing phenolic hydroxyl groups are preferably hydroxystyrenes, hydroxymethylstyrenes, hydroxyphenyl acrylates and methacrylates, for example pyrocatechol monomethacrylate.

Generally suitable as epoxides are those which react with phenolic hydroxyl groups with ring opening. Particularly suitable are epoxides of $(C_1-Cl_{12})$alkenes, such as ethylene oxide (=oxirane), propene oxide (=methyloxirane) and 1,2-butene oxide (=ethyloxirane);

glycidol (=2,3-epoxy-1-propanol=oxiranylmethanol) and its derivatives, in particular its alkyl and aryl ethers such as 2,3-epoxypropyl isopropyl ether, 2,3-epoxypropyl phenyl ether, 2,3-epoxypropyl 4-methoxyphenyl ether, 2,3-epoxypropyl 1-naphthyl ether or N-(2,3-epoxypropyl) phthalimide, and the epoxides of monocyclic and polycyclic, optionally substituted vinyl aromatics, such as styrene oxide and 1-naphthyloxirane.

Suitable as activated carbonic esters are all the compounds containing —$OR^2$ as alcohol component. Preferred are alkyl chloroformates (for example, isopropyl chloroformate, sec-butyl chloroformate and isopentyl chloroformate) and dialkyl pyrocarbonates (for example, di-tert-butyl pyrocarbonate=di-tert-butyl dicarbonate).

Processes for reacting compounds containing phenolic hydroxyl groups with epoxides or activated carbonic esters are familiar to the person skilled in the art.

Particularly advantageously, polymers containing such groups are reacted in a "one-pot" reaction, without isolating an intermediate compound. For this purpose, the polymer is dissolved in a solvent which is inert under the reaction conditions, a catalyst is added and then the epoxide (or mixture of epoxides) and the activated carbonic ester are added. This sequence can also be modified by first adding the activated carbonic ester and then the epoxide. The reaction mixture is heated if necessary. At the same time, it may be advantageous to wait a certain time between adding the first and the second component. The catalyst may be heterogeneous or homogeneous. Preferred catalysts are acidic or basic ion exchangers, alkali-metal hydroxides, Brønsted and Lewis acids and also tertiary amines and quaternary ammonium salts. Particularly preferred are quaternary ammonium hydroxides and dialkylaminopyridines. Of these, tetramethylammonium hydroxide, benzyltrimethylammonium hydroxide (®Triton B) and 4-dimethylaminopyridine (DMAP) are particularly preferred.

Suitable inert solvents are ethers (for example, diisopropyl ether and tetrahydrofuran), ketones (for example, acetone and ethyl methyl ketone), chlorinated hydrocarbons (for example, chloroform and trichloroethylene) and glycol ethers (for example, ethylene glycol monomethyl ether). Suitable to a limited extent are also alcohols, particularly weakly nucleophilic aliphatic alcohols, such as methanol and ethanol. Particularly preferred are propylene glycol monomethyl ether, tetrahydrofuran, acetone and methyl ethyl ketone. In principle, however, all the solvents which do not react irreversibly with the other components are suitable.

After completion of the reaction, the reaction product can be isolated by known methods, for example by precipitation in water or by distillation of the solvent, if necessary, under reduced pressure. If the binder a) is prepared by modifying a polymer containing phenolic hydroxyl groups, after the reaction is complete, the reaction mixture may also be used directly for coating, if necessary after removing the heterogeneous catalyst or adding further components.

Suitable as radiation-sensitive component b) which forms strong acid on irradiation are many known compounds. These include diazonium, phosphonium, sulfonium and iodonium salts, halogen compounds, and also organometal/organohalogen combinations.

The diazonium, phosphonium, sulfonium and iodonium compounds mentioned are as a rule used in the form of their salts which are soluble in organic solvents, for example, in the form of alkane sulfonates, highly fluorinated or perfluorinated alkane sulfonates, tetrafluoroborates, hexafluorophosphates, hexafluoroantimonates or hexafluoroarsenates. Particularly preferred are diazonium perfluoroalkane sulfonates, and also diazonium 1,1,2,3,3,3-hexafluoropropane sulfonates.

The acidity of the indene-2-carboxylic acid produced on exposing 1,2-naphthoquinone 2-diazide which is not further substituted is generally only just sufficient for an imagewise differentiation. For this reason, (o-quinone diazide) sulfonyl chlorides, (o-quinone diazide) sulfonic esters and (o-quinone diazide) sulfonamides are taken as radiation-sensitive compounds b). Of these, (1,2-naphthoquinone 2-diazide)-4-sulfonyl chloride is particularly preferred since three equivalents of acid (carboxylic acid, sulfonic acid and HCl) are liberated when it is exposed to light and a relatively high amplification factor is thus achieved.

The compounds b) may also be so-called "photochemical free-radical starters" which form hydrohalic acid when exposed to actinic radiation. Those containing more than one halogen atom are generally used. Their spectral sensitivity can be modified by the known sensitizers. Examples of suitable starters for use in the radiation-sensitive mixture according to the invention are: (1,2-naphthoquinone 2-diazide)-4-sulfonyl chloride, 4-dipropylaminobenzenediazonium tetrafluoroborate, 4-dipropylaminobenzenediazonium hexafluorophosphate and 4-dipropyl-aminobenzenediazonium trifluoromethanesulfonate, 2,5-diethoxy-4-p-tolylmercaptobenzenediazonium tetrafluoroborate, 2,5-diethoxy-4-p-tolylmercaptobenzenediazonium hexafluorophosphate, 2,5-diethoxy-4-p-tolylmercaptobenzenediazonium trifluoromethanesulphonate and 2,5-diethoxy-4-p-tolylmercaptobenzenediazonium 1,1,2,3,3,3-hexafluoropropanesulfonate, 4-anilinobenzenediazonium sulfate, 4-diethylaminobenzenediazonium trifluoromethanesulfonate, 4-methyl-6-trichloromethyl-2-pyrone, 4-(3,4,5-trimethoxystyrene)-6-trichloromethyl-2-pyrone, 4-(4-methoxystyrene)-6-(3,3,3-trichloropropenyl)-2-pyrone, 2-trichloromethylbenzimidazole, 2-tribromomethylquinolone, 2,4-dimethyl-1-tribromoacetylbenzene, 3-nitro-1-tribromoacetylbenzene, 4-dibromoacetylbenzoic acid, 1,4-bisdibromomethylbenzene, various 4,6-bistrichloromethyl-s-triazines such as 2-(6-methoxy-2-naphthyl)-, 2-(1-naphthyl)-, 2-(2-naphthyl)-, 2-[4-(2-ethoxyethyl)-1-naphthyl]-, 2-(3-benzopyranyl)-, 2-(9-phenanthrenyl)-4,6-bistrichloromethyl, 2-(4-styrylphenyl)-4,6-bistrichloromethyl-, 2-(4-methoxy-1-anthryl)-4,6-bistrichloromethyl-s-triazine, trisdibromomethyl-s-triazine and the compounds cited in the examples.

The proportion of the starter may also be very varied depending on its chemical constitution and the composition of the mixture. Beneficial results are obtained with a proportion of approximately 0.1 to 20 percent by weight, preferably 0.2 to 10 percent by weight, based in each case on the total weight of the nonvolatile constituents of the mixture, i.e., the constituents of the solid photosensitive coating obtained after evaporation of the solvent. For copying layers having thicknesses above 10 µm, in particular, it is advisable to use relatively small amounts of the acid-forming component.

The mixture according to the invention may also contain other polymers. Of these, vinyl polymers such as polyvinyl acetate, polyacrylate, polyvinyl ether and polyvinylpyrrolidone, which may themselves be modified by comonomers, are preferred. The most favorable proportion of these polymers depends on the application requirements and the development conditions. In general, it is not more than 20 percent by weight, based on the total weight of the polymeric binders a).

Finally, depending on the application purpose, the mixture according to the invention may also contain minor amounts of polyglycols, cellulose derivatives such as ethylcellulose, wetting agents, UV absorbers, dyes and finely divided pigments. The triphenylmethane dyestuffs, in particular in the form of their carbinol bases, have proved satisfactory as dyes. The most beneficial quantitative ratios of the components can easily be determined in the individual case by preliminary experiments.

Finally, the present invention also relates to a recording material having a base and a radiation-sensitive layer, wherein the layer is composed of the radiation-sensitive mixture according to the invention.

The recording material is produced by applying a solution of the mixture according to the invention to the base and then removing the solvent. Suitable as solvents are ketones (such as methyl ethyl ketone), chlorinated hydrocarbons (such as trichloroethylene and 1,1,1-trichloroethane), alcohols (such as n-propanol), ethers (such as tetrahydrofuran), alcohol ethers (such as ethylene glycol monoethyl ether) and esters (such as butyl acetate). Mixtures thereof may also be used. As additional solvent, acetonitrile, dioxane or dimethylformamide may also be present. Generally, all those solvents can be used which do not react with the constituents of the mixture according to the invention or the base material in an undesirable way.

Solvents and the proportion of solids in the solvent also depend on the coating and drying processes. Coatings up to approximately 5 µm thick are generally spun on or applied using a doctor blade and then dried. The solutions used in these processes have a solids content of up to about 40 percent by weight. If the base material is to be coated on both sides, it is immersed in a suitable solution. Solvents which are low-boiling and consequently easy to remove allow the coating to dry rapidly. The coating can also be carried out by spraying-on or by application with the aid of rollers or flat-film dies. Single plates, in particular those composed of zinc or multimetal are advantageously coated by casting application (curtain coating).

Compared with other positive coatings, particularly those based on o-naphthoquinonediazide, it is possible to expose to light and process layer thicknesses of up to approximately 100 µm and over since the photosensitivity of the mixtures according to the invention depends relatively little on thickness.

Coatings having a thickness of more than 10 µm are usually first applied to a temporary base (normally a plastics film) and are transferred from there to the final base. The plastics film is frequently a polyester (for example, poly (ethylene terephthalate)) or a polyolefin film (for example, polypropylene).

To produce offset printing plates, the recording materials usually have a base composed of mechanically and/or electrochemically grained and optionally anodized aluminum which may also be pretreated chemically, for example with polyvinylphosphonic acid, silicates or phosphates. Multimetal plates having a Cu/Cr or brass/Cr surface are also suitable. The recording coatings applied thereto are usually thinner than 10 µm.

To produce letterpress plates, the base materials used are zinc or magnesium bases or their commercial microcrystalline alloys for single-stage etching processes or etchable plastics such as polyoxymethylene.

Suitable for gravure forms or screen-printing forms are bases having copper or nickel surfaces, to which the mixture according to the invention adheres particularly well. These coatings are also notable in this connection for the good resistance to etching.

The mixtures according to the invention can furthermore be used as photoresists and in chemical milling. They are also suitable for coating printed circuit boards composed of electrically nonconducting material and provided with a copper cladding on one or both sides, glass or ceramic materials optionally pretreated with an adhesion promoter, silicon wafers on whose surface there may optionally be a nitride or oxide layer; the coating can be carried out directly or with the aid of a temporary base;

wood, textiles and the surfaces of many materials which are provided with an image by projection and are resistant to the action of alkaline developers.

The standard apparatus and conditions may be adopted for drying the layer, and temperatures around 100° C. and, for a short time, of up to 120° C. are tolerated without loss of sensitivity to radiation.

The standard copying equipment such as tubular lamps, xenon pulse lamps, metal-halide-doped mercury-vapor high-pressure lamps and carbon-arc lamps can be used for exposure to light. In addition, the exposure to light is possible in standard projection and enlargement equipment under the light of metal-filament lamps and contact exposure is possible using standard incandescent lamps. The exposure to light can also be carried out with the coherent light of a laser. Shortwave lasers of the correct power, for example argon ion lasers, krypton ion lasers, dye lasers and helium/cadmium lasers, which emit between 300 and 600 nm are suitable. The laser beam is controlled with a specified programmed line and/or raster movement.

The irradiation with electron beams is a further possibility for providing an image. Electron beams are capable of extensively decomposing and crosslinking the mixture according to the invention, like many other organic materials, so that a negative image is produced if the unirradiated parts are removed by solvents or exposure without a master and development. On the other hand, at low intensity and/or relatively high writing speed of the electron beam, the latter effects a differentiation in the direction of higher solubility, i.e. the irradiated areas of the coating can be removed by the developer. The choice of the most favorable conditions can easily be determined by preliminary experiments.

The imagewise exposed and irradiated coating can be removed (if necessary, after a thermal aftertreatment step to complete the reaction initiated by the photolytically liberated acid) using virtually the same developers as for commercial naphthoquinone diazide coatings and photoresists. The copying conditions of the novel coatings may advantageously be adapted to the known aids, such as developers and programmed spray developers. The aqueous developer solutions may contain, for example, alkali-metal phosphates, alkali-metal silicates or alkali-metal hydroxides and, furthermore, wetting agents and smaller proportions of organic solvents. In certain cases, solvent/water mixtures may also be used as developers. The most favorable developers can be determined by experiments with the coating used in a particular case. If necessary, the development may be assisted mechanically. To increase the resistance during printing and the resistance to wash-out agents, deletion fluid and inks which can be cured by UV light, the developed plates may be heated for a short time to elevated temperatures, as is disclosed in GB-A 1 154 749 for diazo coatings.

Finally, the invention also relates to a process for producing relief images in which a radiation-sensitive recording material is imagewise irradiated with actinic radiation and afterheated if necessary, and the irradiated parts of the coating are washed out with a liquid developer.

The examples below disclose the synthesis of the binders which can be used for preparing the photosensitive coatings according to the invention and the preferred mixtures according to the invention themselves, without limiting the invention to them.

EXAMPLE 1

7.5 g of a polymer (hydroxyl number 267) obtained by reacting 1 molar equivalent of poly(4-hydroxystyrene) (MW 4500 g/mol, hydroxyl number 455) with 0.3 molar equivalents of di-tert-butyl dicarbonate were dissolved in 50 ml of methyl ethyl ketone, 0.1 g of tetramethylammonium hydroxide and 3.3 ml of 2,3-epoxypropanol were added and heating was carried out for 3 h under reflux. After precipitation in water, filtration by suction and drying, 7.4 g was obtained of an alkali-soluble polymer having the hydroxyl number 359. The ratio of the free phenolic OH groups to the tBOC and aliphatic OH groups was determined as 35:25:40 by $^1$H-NMR.

EXAMPLE 2

7.5g of a poly(4-hydroxystyrene) partially acylated with di-tert-butyl dicarbonate (hydroxyl number 267; see Example 1) were dissolved in 50 ml of methyl ethyl ketone and 0.1 g of tetramethylammonium hydroxide and 1 ml of 2,3-epoxypropyl isopropyl ether were added, and heating was carried out for 2 h under reflux. After precipitation in water, filtration by suction and drying, 7.4 g was obtained of an alkali-soluble resin. The ratio of the free phenolic OH groups to the tBOC and aliphatic OH groups was determined as 65:25:10 by $^1$H-NMR.

EXAMPLE 3

The procedure was as in Example 2, but 2,3-epoxypropyl o-tolyl ether was used instead of 2,3-epoxypropyl isopropyl ether. The polymer obtained had a ratio of the free phenolic OH groups to the tBOC and aliphatic OH groups of 65:25:10 (determined by $^1$H-NMR).

EXAMPLE 4

2 ml of a 40 percent-strength solution of benzyltrimethylammonium hydroxide (®Triton B) in methanol and 16 ml of 2,3-epoxypropanol were added to a solution of 192 g of poly(4-hydroxystyrene) (MW 4500 g/mol, hydroxyl number 455) in 750 ml of propylene glycol monomethyl ether (®Dowanol PM). The mixture was heated for 7 h under reflux. After cooling to room temperature, 0.5 g of 4-dimethylaminopyrydine were then added. A solution of 105 g of di-tert-butyl dicarbonate in 100 ml of propylene glycol monomethyl ether was then added dropwise while stirring with a magnetic stirrer, stirring was continued for 4 h at room temperature, precipitation was carried out in water, and the precipitate was filtered by suction and dried (40° C./50 mbar). The ratio of the free phenolic OH groups to the tBOC and aliphatic OH groups was determined as 55:30:15 in the polymer obtained (253 g; hydroxyl number 296) with the aid of $^1$H-NMR.

EXAMPLE 5

Plates composed of electrochemically grained and anodized aluminum were spin-coated with a solution composed of 3.60 parts by weight of the binder described in Example 4 (prepared from poly(4-hydroxystyrene), 2,3-epoxypropanol and di-tert-butyl dicarbonate), 0.20 parts by weight of 4-p-tolylmercapto-2,5-diethoxybenzenediazonium hexafluorophosphate, 0.03 parts by weight of crystal violet base and 35 parts by weight of methyl ethyl ketone and heated in a drying oven at 100° C. After drying, the coating thickness was 1.8 to 2.0 μm. The plates were exposed to light through a picture copy under a 5 kW metal-halide lamp at a distance of 110 cm for 20 s, afterheated for 1 min at 100° C. and developed in an aqueous alkaline developer having the composition 5.5 parts by weight of sodium metasilicate.9 $H_2O$, 3.4 parts by weight of trisodium phosphate.12 $H_2O$, 0.4 parts by weight of anhydrous monosodium phosphate and 90.7 parts by weight of fully demineralized water for 30 s. A positive image was obtained of the film copy which yielded more than 100,000 good-quality impressions in an offset printing press.

EXAMPLE 6

Plates composed of electrochemically grained and anodized aluminum were spin-coated with a solution composed of 3.60 parts by weight of binder 1 (see Example 4 for preparation) or binder 2 (poly(4-hydroxystyrene)) as a comparison, reacted with 0.3 eq of di-tert-butyl dicarbonate), 0.20 parts by weight of 4-p-tolylmercapto-2,5-diethoxybenzenediazonium 1,1,2,3,3,3-hexafluoropropanesulfonate, 0.03 parts by weight of crystal violet base and 35 parts by weight of methyl ethyl ketone and heated in a drying oven at 100° C. After drying, the coating thickness was 1.9 μm. The plates were subjected to an accelerated storage test at 80° C. Samples were taken at various times, exposed to light for 20 s under a 5 kW metal-halide lamp at a distance of 110 cm through a half-tone step wedge having 13 steps with a density gradient of 0.15, afterheated for 1 min at 100° C. and developed in an aqueous alkaline developer (see Example 5) for 30 s. The storage stability was assessed on the basis of the half-tone wedge steps reproduced as completely open or completely closed on the plate, and a dark erosion (solubility of the copying layer in the unexposed areas) was revealed which became increasingly greater with storage time. The following table shows the excellent storage stability of the photosensitive mixtures according to the invention for unaltered copying and printing properties (binder 2 as the comparison).

TABLE

| Time at 80° C. | Open step | | Covered step | |
|---|---|---|---|---|
| | Binder 1 | Binder 2 | Binder 1 | Binder 2 |
| 0 h | 3 | 3 | 8–9 | 9 |
| 1 h | 3 | 4–5 | 9 | 10–11 |
| 2 h | 3–4 | 6 | 10 | 13 |
| 3 h | 4 | 13 | 10–11 | — |
| 4 h | 4–5 | 13 | 11 | — |

What is claimed is:

1. A polymer containing units of the formulae I, II, and III $$R^1\text{—OH} \tag{I}$$

$$R^1\text{—O—CO}_2R^2 \tag{II}$$

$$R^1\text{—O—CH}_2\text{—CHR}^3\text{—OH} \tag{III}$$

where
the $R^1$'s are independently of one another an optionally substituted phenyl radical bound in the main chain or side chain of the polymer,
$R^2$ is a $(C_3–C_{11})$alkyl, $(C_3–C_{11})$alkenyl, or $(C_7–C_{11})$ aralkyl radical,
$R^3$ is a hydrogen atom, an optionally substituted alkyl or aryl radical, a phthalimidomethyl group or the group —CH$_2$OR$^4$, in which $R^4$ is a hydrogen atom, or an optionally substituted aliphatic, cycloaliphatic or aromatic radical.

2. A polymer as claimed in claim 1, wherein the radical $R^2$ is a $C_4$-alkyl.

3. A polymer as claimed in claim 2, wherein the $C_4$-alkyl is tert-butyl.

4. A polymer as claimed in claim 1, wherein the radical $R^3$ is phenyl.

5. A polymer as claimed in claim 1, wherein, of the total number of units of the formulae I, II and III, 10 to 80% are units of the formulae II and III.

6. A polymer as claimed in claim 1, wherein, of the total number of units of formulae I, II and III, 25 to 35% are units of the formulae II and 10 to 50% are units of the formula III.

7. A polymer as claimed in claim 1, wherein the polymer is formed from polyhydroxystyrene, polyhydroxymethylstyrene, poly(pyrocatechol monomethacrylate) or a copolymer containing hydroxystyrene, hydroxymethylstyrene or pyrocatechol monomethacrylate units.

8. A polymer as claimed in claim 7, which is formed from poly(4-hydroxystyrene), poly(4-hydroxymethylstyrene), or poly(pyrocatechol monomethacrylate).

9. A polymer as claimed in claim 1, which is produced by reaction of a polymer containing a phenolic hydroxyl group with an epoxide and an activated carbonic ester.

10. A polymer as claimed in claim 1, which is produced by polymerization or polycondensation of a monomer having a phenolic hydroxyl group that has been reacted with epoxide and a monomer having a phenolic hydroxyl group that has been reacted with activated carbonic ester.

11. A process for producing a polymer as claimed in claim 1, comprising reacting a polymer containing a phenolic hydroxyl group with an epoxide and an activated carbonic ester.

12. A process for producing a polymer as claimed in claim 1, comprising polymerizing or polycondensing a monomer having a phenolic hydroxyl group that has been reacted with epoxide and a monomer having a phenolic hydroxyl group that has been reacted with activated carbonic ester.

* * * * *